United States Patent
Okumura et al.

(10) Patent No.: US 11,227,764 B2
(45) Date of Patent: Jan. 18, 2022

(54) LASER IRRADIATION METHOD AND LASER IRRADIATION APPARATUS

(71) Applicant: SAMSUNG DISPLAY CO., LTD., Yongin-si (KR)

(72) Inventors: Hiroshi Okumura, Yongin-si (KR); Jongjun Baek, Yongin-si (KR); Dong-Sung Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/592,087

(22) Filed: Oct. 3, 2019

(65) Prior Publication Data
US 2020/0185222 A1 Jun. 11, 2020

(30) Foreign Application Priority Data
Dec. 5, 2018 (KR) .......................... 10-2018-0155539

(51) Int. Cl.
*H01L 21/02* (2006.01)
*H01L 21/67* (2006.01)

(52) U.S. Cl.
CPC .. *H01L 21/02691* (2013.01); *H01L 21/67115* (2013.01); *H01L 21/02678* (2013.01); *H01L 21/02683* (2013.01); *H01L 21/02686* (2013.01)

(58) Field of Classification Search
CPC ......... H01L 21/02691; H01L 21/02683; H01L 21/02686; H01L 21/02595; H01L 21/32055; H01L 21/67115
See application file for complete search history.

(56) References Cited

U.S. PATENT DOCUMENTS

| | | | |
|---|---|---|---|
| 4,469,551 A | 9/1984 | Laude | |
| 6,281,470 B1 * | 8/2001 | Adachi | H01L 21/2026 219/121.62 |
| 7,679,800 B2 * | 3/2010 | Yamazaki | B23K 26/0643 359/202.1 |
| 9,564,322 B1 * | 2/2017 | Han | B23K 26/00 |
| 2003/0058916 A1 * | 3/2003 | Tanaka | H01L 21/02678 372/101 |
| 2019/0189831 A1 * | 6/2019 | Huang | H01L 21/67092 |

FOREIGN PATENT DOCUMENTS

KR 10-0813351 B1 3/2008
KR 10-2009-0119818 A 11/2009

* cited by examiner

*Primary Examiner* — Tuan A Hoang
(74) *Attorney, Agent, or Firm* — Kile Park Reed & Houtteman PLLC (57) ABSTRACT

A laser irradiation method includes a first scanning wherein a laser beam is scanned in a first region having a width in the X direction and a length in the Y direction by moving a laser irradiation area on the surface of the substrate along the Y direction using a spot laser beam, and a second scanning wherein laser beam is scanned in a second region having a width in the X direction and a length in the Y direction by moving a laser irradiation area on the surface of the substrate along the Y direction using the spot laser beam. A center of the second region is spaced apart from a center of the first region in the X direction.

10 Claims, 9 Drawing Sheets

LASER IRRADIATION METHOD AND LASER IRRADIATION APPARATUS

CROSS-REFERENCE TO RELATED APPLICATION

Korean Patent Application No. 10-2018-0155539, filed on Dec. 5, 2018, in the Korean Intellectual Property Office, and entitled: "Laser Irradiation Method and Laser Irradiation Apparatus," is incorporated by reference herein in its entirety.

BACKGROUND

1. Field

Exemplary embodiments relate to a laser irradiation method, and a laser irradiation apparatus for the laser irradiation method. More particularly, exemplary embodiments relate to a laser irradiation method for forming a poly-silicon, and a laser irradiation apparatus for the laser irradiation method.

2. Description of the Related Art

Recently, a display apparatus having light weight and small size has been manufactured. A cathode ray tube (CRT) display apparatus has been used due to a performance and a competitive price. However, the CRT display apparatus has a weakness with a size or portability. Therefore, a display apparatus such as a plasma display apparatus, a liquid crystal display apparatus and an organic light emitting display apparatus has been highly regarded due to small size, light weight and low-power-consumption.

The display apparatus may include an active pattern of a thin film transistor which includes poly-silicon. The poly-silicon may be formed by crystallizing an amorphous silicon layer by irradiating an excimer laser to the amorphous silicon.

SUMMARY

Embodiments are directed to a laser irradiation method to scan onto a surface of a substrate arranged in a plane formed by a X direction and a Y direction perpendicular to the X direction. The laser irradiation method includes a first scanning wherein laser beam is scanned in a first region having a width in the X direction and a length in the Y direction by moving a laser irradiation area on the surface of the substrate along the Y direction using a spot laser beam, and a second scanning wherein laser beam is scanned in a second region having a width in the X direction and a length in the Y direction by moving a laser irradiation area on the surface of the substrate along the Y direction using the spot laser beam. A center of the second region is spaced apart from a center of the first region in the X direction.

An incident angle ($\theta$) of the laser beam, a divergence angle ($\theta y$) of the laser beam, and a tilt angle $\varphi$ with respect to the substrate satisfy the following equation.

$$\theta y[\text{mrad}] < 9.33 \times \theta[\text{deg}] \qquad \text{<equation>}$$

The incident angle ($\theta$) may be larger than 0° (deg) and less than 7.5°.

The laser beam may be generated by a continuous oscillation laser oscillator or a pulse oscillation laser oscillator having a repetition frequency of 30 MHz or more.

The laser oscillator may be a solid laser selected from a YAG laser, a YVO$_4$ laser, a YLF laser, a YAlO$_3$ laser, a Y$_2$O$_3$ laser, a glass laser, a ruby laser, an alexandrite laser and a Ti:sapphire laser.

A converging angle ($\alpha$) of the laser beam may be not more than 30 [mrad.

The laser beam may be irradiated onto the substrate through a laser light source, a first lens and a scanner in order. The laser irradiation area may be moved by a physical movement of the scanner.

The scanner is a rotatable galvano mirror.

The scanner is a rotatable polygonal mirror.

A diameter of the laser beam at the laser source from which the laser beam is generated may be less than or equal to 10 millimeters. The diameter of the laser beam on the substrate may be less than or equal to 100 micrometers. An optical path from the laser source to the substrate may be more than 1 meter.

The laser irradiation method may include forming an amorphous silicon layer on the substrate and irradiating the laser beam onto the amorphous silicon layer to crystallize the amorphous silicon layer.

The first region and the second region may partially overlap each other.

Embodiments are also directed to a laser irradiation apparatus for irradiating a laser beam onto a substrate, the laser irradiation apparatus including a laser light source for generating the laser beam, a first lens through which the laser beam generated from the laser light source passes, and a scanner that reflects the laser beam that has passed through the first lens and the scanner being to change a direction of the laser beam which is reflected. An incident angle ($\theta$) of the laser beam, a divergence angle ($\theta y$) of the laser beam, and a tilt angle $\varphi$ with respect to the substrate satisfy the following equation.

$$\theta y[\text{mrad}] < 9.33 \times \theta[\text{deg}] \qquad \text{<equation>}$$

The incident angle ($\theta$) may be larger than 0° (deg) and less than 7.5°.

The laser beam may be generated by a continuous oscillation type laser oscillator or a pulse oscillation type laser oscillator having a repetition frequency of 30 MHz or more.

The laser oscillator may be a solid laser selected from a YAG laser, a YVO$_4$ laser, a YLF laser, a YAlO$_3$ laser, a Y$_2$O$_3$ laser, a glass laser, a ruby laser, an alexandrite laser or a Ti:sapphire laser.

A converging angle ($\alpha$) of the laser beam may be not more than 30 mrad.

The scanner may be a rotatable polygonal mirror.

The scanner may be a rotatable galvano mirror.

A diameter of the laser beam at the laser source from which the laser beam is generated may be less than or equal to 10 millimeters, the diameter of the laser beam on the substrate may be less than or equal to 100 micrometers, and an optical path from the laser source to the substrate may be more than 1 meter.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
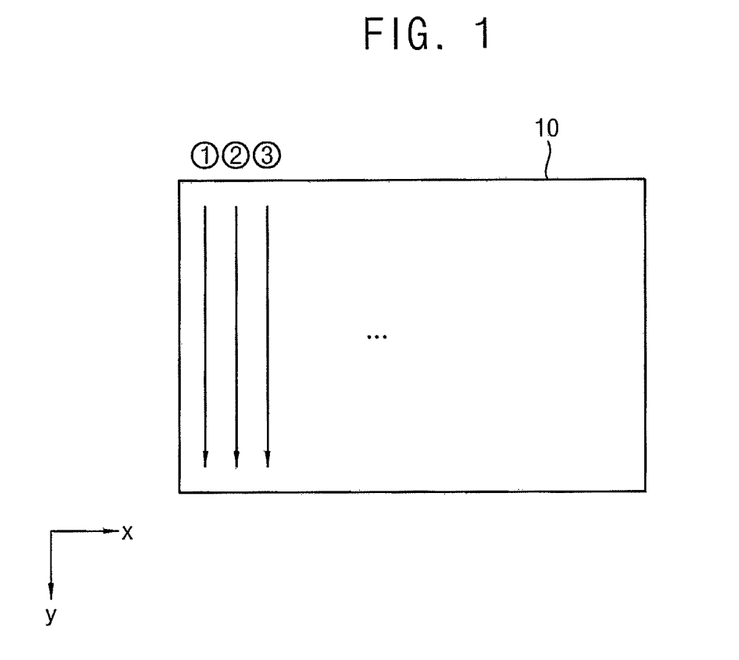
FIG. 1 illustrates a plan view of a substrate on which a laser irradiation method according to an exemplary embodiment is performed.
Figure 2:
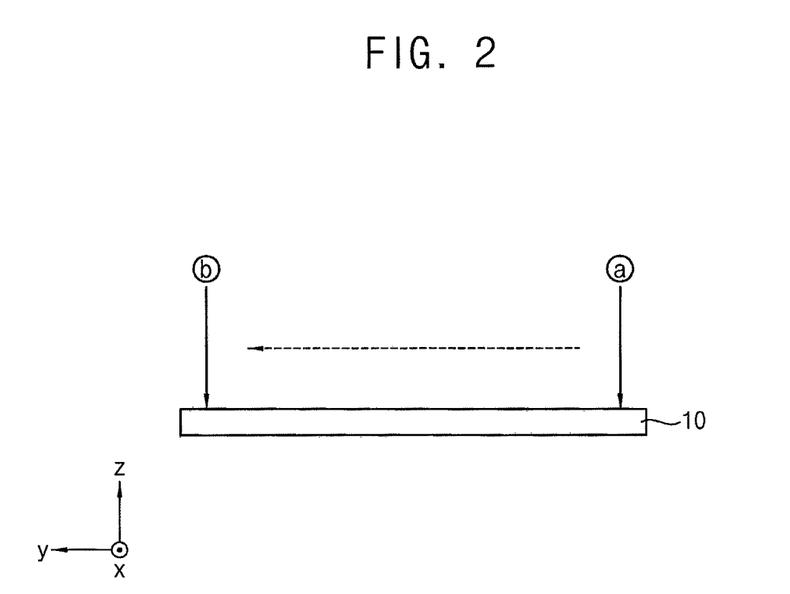
FIG. 2 illustrates a side view of the substrate of FIG. 1.

FIG. 1 illustrates a plan view of a substrate on which a laser irradiation method according to an exemplary embodiment is performed. FIG. 2 illustrates a side view of the substrate of FIG. 1.

Referring to FIGS. 1 and 2, according to the laser irradiation method, a spot laser beam may be scanned in a Y direction (y) perpendicular to a X direction (x) on a substrate 10 a plurality of times to irradiate the entire substrate 10. In this manner, the whole of the substrate 10 may be subjected to laser treatment. Hereinafter, the details of the laser irradiation method will be described.

According to the laser irradiation method, a laser beam is irradiated onto a surface of the substrate 10 using the spot beam laser. The laser beam may be irradiated onto the surface of the substrate 10. A laser irradiation area irradiated with the laser beam may be moved along the Y direction. Accordingly, the laser beam can be irradiated to a line region using the spot beam laser. Thus, the laser beam may be scanned in a first region having a width in the X direction (x) and a length in the Y direction (y) (first scan step, see an arrow corresponding ① in the drawing)

An irradiation point of the spot laser beam may be moved a predetermined distance in the X direction (x), and then the laser may be irradiated onto the surface of the substrate 10, so that a laser irradiation area irradiated with the laser beam may be moved along the Y direction (y). Thus, the laser beam may be scanned in a second region having a width in the X direction (x) and a length in the Y direction (y) (second scan step, see an arrow corresponding ② in the drawing)

Thereafter, the irradiation point of the spot laser beam may be moved a predetermined distance in the X direction (x), and then the laser beam may be irradiated onto the surface of the substrate 10, so that a laser irradiation area irradiated with the laser may be moved along the Y direction (y). Thus, the laser beam may be scanned in a third region having a width in the X direction (x) and a length in the Y direction (y) (third scan step, see an arrow corresponding ③ in the drawing)

The above steps may be repeated to irradiate the entire substrate 10 with the laser beam.

Centers of the first to third regions may be spaced apart by a certain distance in the X direction, and the first to third regions may partially overlap each other.

The laser beam may be scanned at a speed of about 30 m/s, a moving pitch along the X direction may be about 2 mm. An incident angle of the laser beam (θ) may be about 7° (degrees) and a divergence angle (θy) may be about 0±15 mrad (milliradian).

An amorphous silicon layer may be formed on the substrate 10. The amorphous silicon layer may be crystallized by laser irradiation to form poly-silicon. For example, crystallization due to near complete melting of the amorphous silicon may be caused by the irradiated laser.

Generally, when a laser beam has a pulse energy per light source of 1 J or more and an energy density on the substrate 10 is about 470 mJ/cm^2, a crystal size of about 300 nm (nanometer) can be obtained in a form of a square having a relatively high uniformity.

Figure 3:
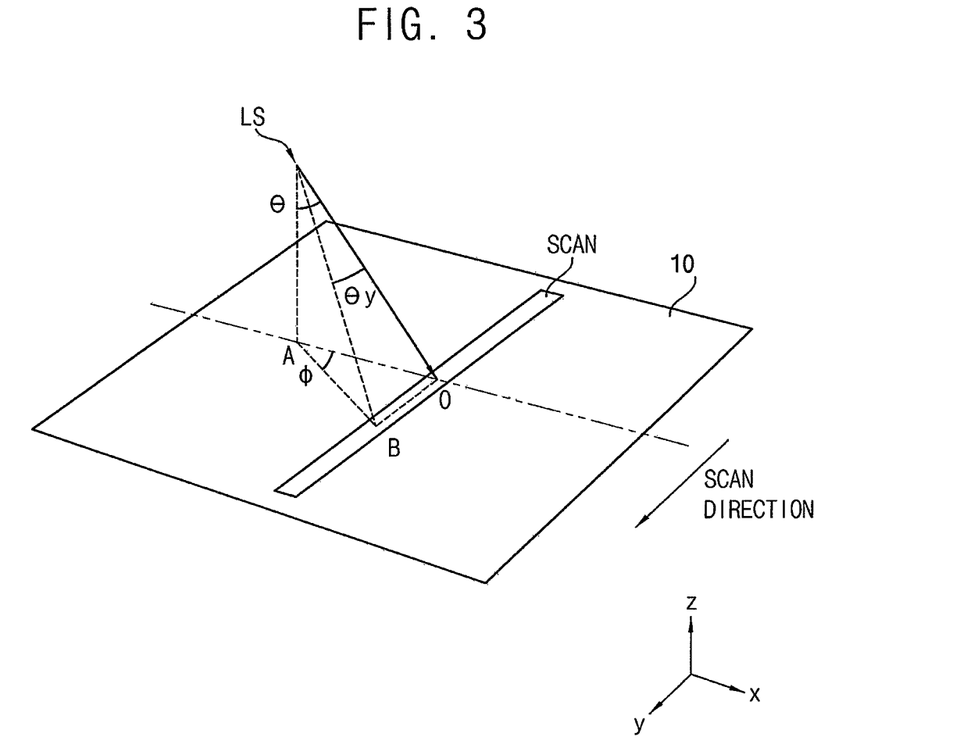
FIG. 3 is a diagram illustrating incident angle, divergence angle, and tilt angle components of a laser beam in the laser irradiation method of FIG. 1.

FIG. 3 is a diagram illustrating incident angle, divergence angle, and tilt angle components of the laser in the laser irradiation method of FIG. 1.

Referring to FIG. 3, an incident angle θ, a divergence angle θy, and a tilt angle φ of the laser generated by the laser light source LS with respect to the substrate 10 are shown. Here, the incident angle θ, the divergence angle θy, and the tilt angle component φ have the following relationships: When line (O-A)=1, line($O$-$B$)=tan($\varphi$)

line($O$-$LS$)=1/sin($\theta$)

($OB$/$O$-$LS$)=tan($\theta y$)

Summarizing this, when $\theta y$=arctan(tan $\varphi \times$sin $\theta$), the above relationship can be obtained.

When the tilt angle φ is increased, an angle of protrusion of the poly-silicon layer on the substrate 10 changes, and an alignment property deteriorates. When grains of the poly-silicon do not have the tilt angle φ component, a quadrangular crystal is formed. When the tilt angle φ component increases, the grains change into a polygon. When the tilt angle φ is 30°, a hexagonal stable crystal(grain) is formed. Thereafter, when the tilt angle φ is larger than 30°, the crystal changes to an irregular square shape, and the alignment property is lowered.

Figure 4:
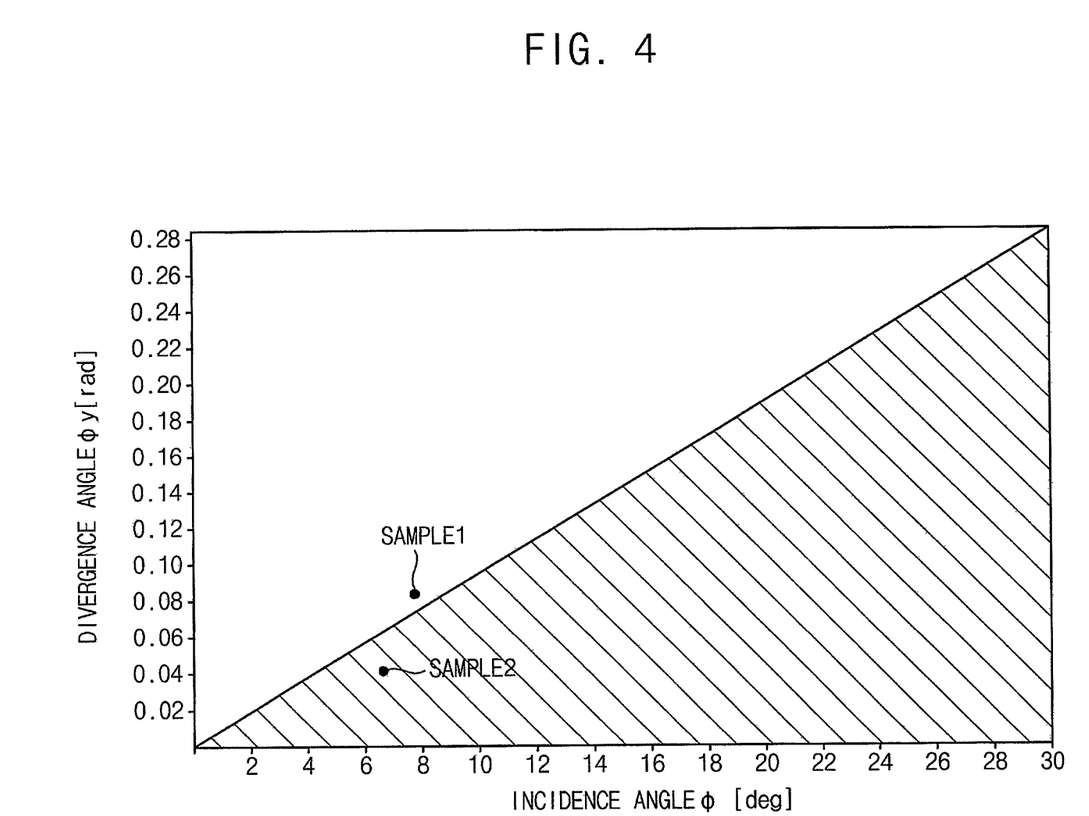
FIG. 4 illustrates a graph showing changes of a crystal of poly-silicon according to changes of an incident angle and a divergence angle of the laser beam in the laser irradiation method of FIG. 1.
Figure 5A:
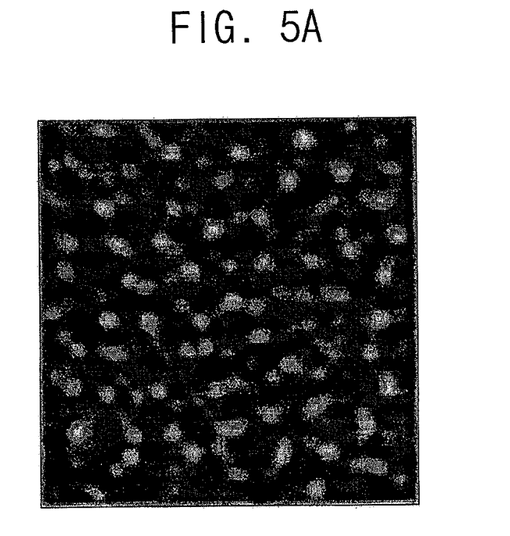
FIGS. 5A and 5B illustrate images of crystals of poly-silicon according to Sample 1 and Sample 2 of FIG. 4.
Figure 5B:
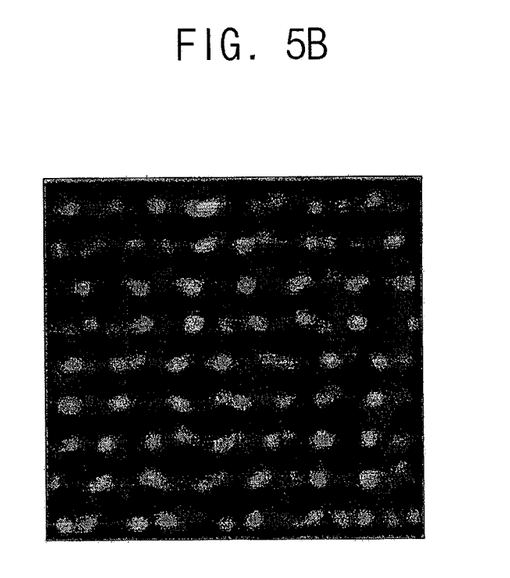

FIG. 4 is a graph showing crystal properties of poly-silicon according to changes of an incident angle and a divergence angle of the laser beam in the laser irradiation method of FIG. 1. FIGS. 5A and 5B illustrate images of crystals of poly-silicon of Sample 1 and Sample 2 of FIG. 4.

Referring to FIGS. 3 and 4, on the basis of the above description, assuming that alignment occurs when the tilt angle is 30 degrees or less, by calculating this, the relationship illustrates in the graph of FIG. 4 can be obtained. For example, the graph shows a range of the divergence angle θy at which the aligned crystals can be obtained according to the incident angle θ. For example, it can be understood that when the incident angle θ and the divergence angle θy are located in a hatched region of the graph, a crystal having excellent alignment can be obtained.

When the hatched area of the graph is formulated, the following equation can be obtained.

θy[mrad]<9.33×θ[deg]     <equation>

Referring with FIGS. 5A and 5B, when a laser beam corresponding to incidence angles shown for sample 1 (SAMPLE1) and sample 2 (SAMPLE2) is irradiated, square grains(crystals) with high alignment can be obtained under the condition corresponding to the sample 2 (SAMPLE2).

Figure 6:
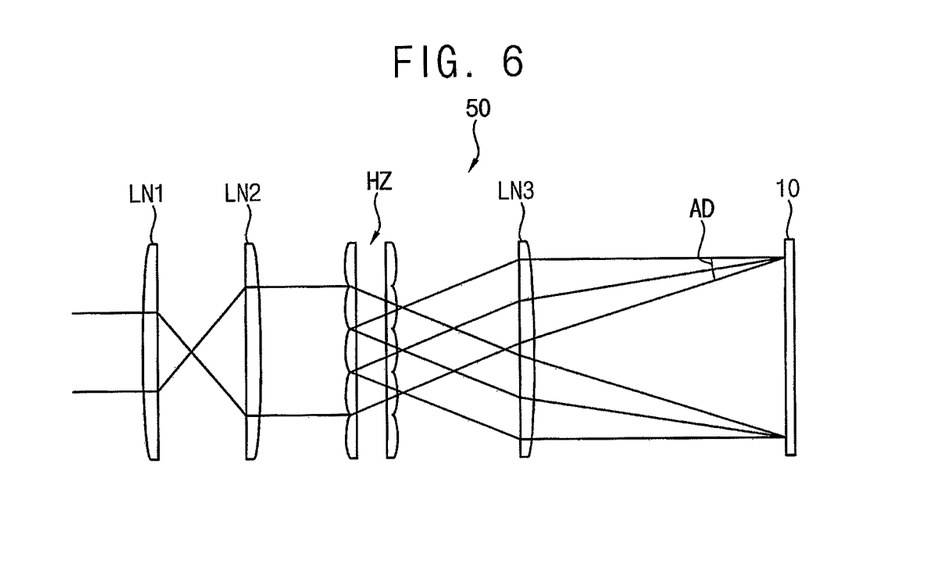
FIG. 6 illustrates a diagram showing an angular distribution of the laser beam of a conventional laser irradiation apparatus 50.

FIG. 6 illustrates a diagram showing an angular distribution of the laser of a general laser irradiation apparatus 50.

Referring to FIG. 6, the general laser irradiation apparatus 50 may include a first lens LN1, a second lens LN2, a homogenizer HZ, and a third lens LN3. Laser light generated from a laser light source of the laser irradiation device 50 passes through the first lens LN1, the second lens LN2, the homogenizer HZ and the third lens LN3 in order. The laser light may be irradiated in a form of a line beam onto the substrate 10.

Here, a vertical direction in FIG. 6 is the long side direction of the line beam, and an illustrated laser path shows an optical system in the long side direction of the line beam of the laser irradiation device 50.

The homogenizer HZ may receive a laser beam having an energy density of Gaussian distribution and may convert the laser beam into a laser beam having a uniform energy density in one direction.

An angular distribution (AD) due to a path difference of the laser beam is shown in the drawing. It is confirmed by an experiment that an alignment property of grains of poly-silicon on a substrate 10 was poor when the angular distribution AD was too large. The alignment was shown to be excellent when the angle distribution was 40 mrad (milliradian), but was shown to be poor when the angle distribution was 62 mrad.

For example, the alignment of the crystals of poly-silicon is related to the angular distribution of the laser beam. Degree alignment property may be obtained when the angular distribution is not more than a certain degree.

Figure 7:
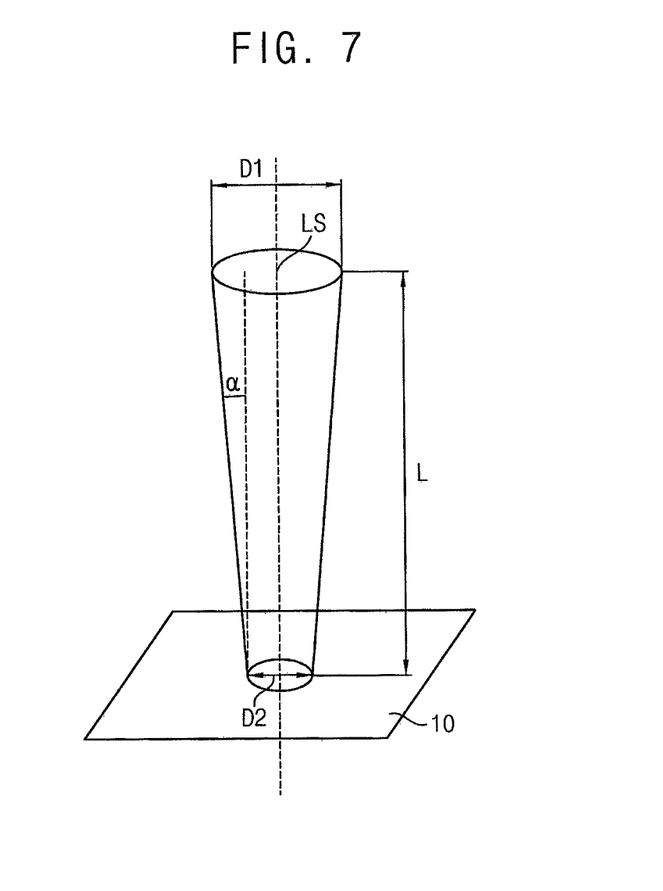
FIG. 7 illustrates a view showing a focusing angle α of the laser beam in the laser irradiation method of FIG. 1.

FIG. 7 illustrates a view showing a focusing angle α of the laser beam in the laser irradiation method of FIG. 1.

Referring to FIG. 7, the laser irradiation method according to an embodiment irradiates a spot laser beam in a scanning manner unlike the general laser irradiation apparatus 50, so that influence of the angular distribution may be different from that in the general laser irradiation apparatus 50.

As shown in the drawing, a distance from the laser light source LS to the substrate 10 is referred to as an optical path L, a diameter of the laser in the laser light source LS is referred to as D1, a diameter of the laser beam on the substrate 10 is referred as D2. The converging angle α, which indicates degree of condensation of the laser may be represented by α=arctan((D1−D2)/2L).

The angular distribution AD of the spot laser beam of the scanning method as in the present embodiment may be as follows.

(AD)=2*(converging angle α)

Based on the description in FIG. 6, the distribution AD may have a value of at least 60 mrad to obtain good alignment property. A desired range of the converging angle α may be as follows.

(converging angle α)<30mrad

In general, when D1 is much larger than D2, the converging angle α may satisfy the following equation.

converging angle α<arctan((D1/2)/L)=5mrad(milliradians)     <equation>

In one example, when the diameter D1 of the laser beam at the laser light source LS is about 100 mm and the diameter D2 of the laser beam on the substrate 10 is about 10 μm (micrometers), and the optical path (L) is 1 m (1 meter), since D1 is much larger than D2, the converging angle α can be calculated to be 5 mrad (milliradians) by the above equation. Thus, when the converging angle α is less than 30 mrad, it may be predicted that excellent alignment of the poly-silicon crystal may be obtained.

As described above, to satisfy (converging angle α)<<30 mrad, D1, D2, and L of the laser irradiation apparatus may be designed.

Figure 8A:
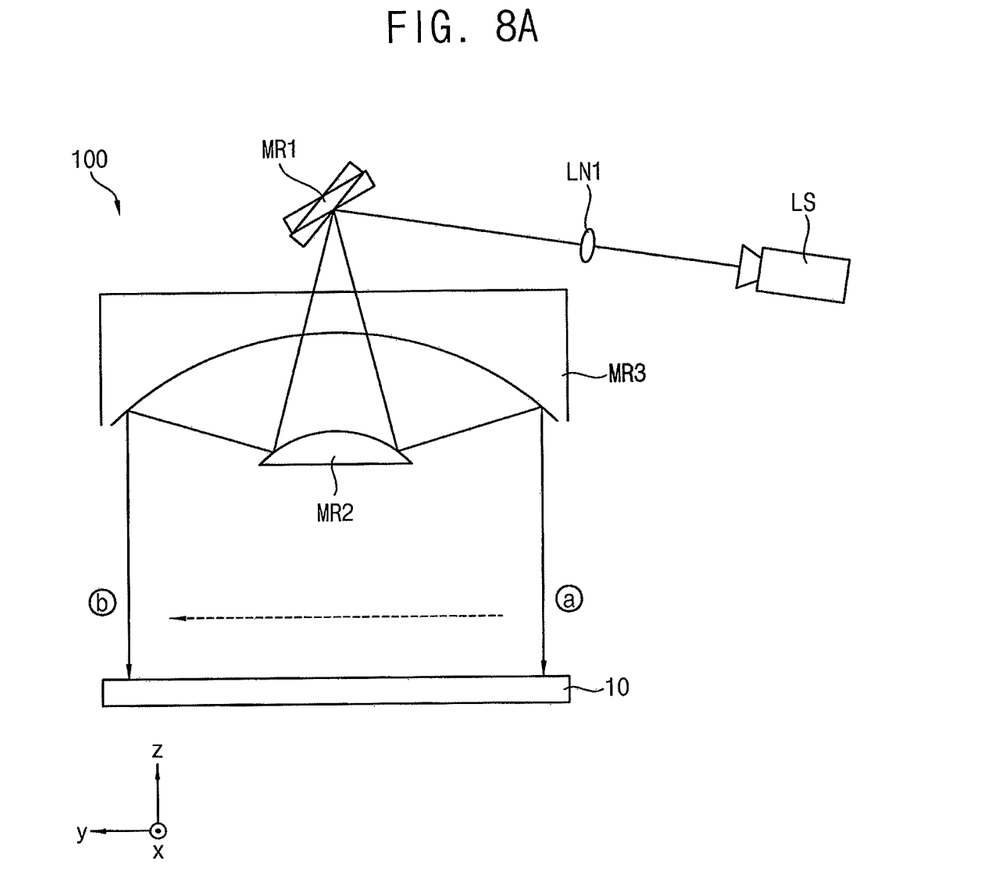
FIGS. 8A and 8B illustrate views of a laser irradiation apparatus 100 according to an exemplary embodiment.
Figure 8B:
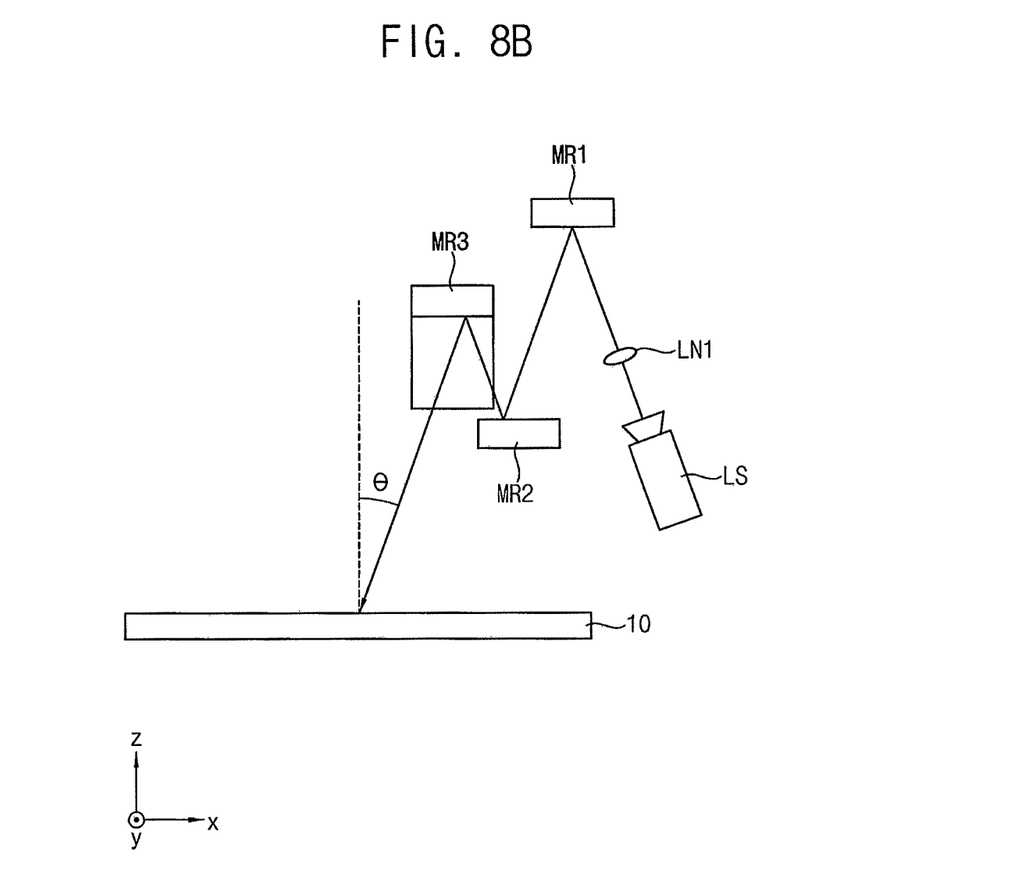

FIGS. 8A and 8B are views illustrating a laser irradiation apparatus 100 according to an exemplary embodiment.

Referring to FIGS. 8A and 8B, the laser irradiation apparatus 100 may include a laser light source LS, a first lens LN1, a first mirror MR1, a second mirror MR2, and a third mirror MR3. The laser irradiation apparatus 100 may irradiate a spot beam laser onto a surface of the substrate 10 in a scanning manner. A dotted line in the figure shows one scan for one scan area. (refers to the first scan step in the description of FIGS. 1 and 2)

The laser light source LS may be a laser oscillator. A laser beam is generated by a continuous oscillation type laser oscillator or a pulse oscillation type laser oscillator having a repetition frequency of 30 MHz or more. For example, the laser oscillator may emit a laser beam with a wavelength of 532 nm at a repetition frequency of 30 MHz, or a laser beam with a wavelength of 355 nm. For example, when the laser oscillator uses a Nd:YAG laser (1064 nm) solid-state laser, a second harmonic wave may have a wavelength of 532 nm, and a third harmonic wave may have a wavelength of 355 nm.

The laser oscillator may use a suitable continuous oscillation solid laser. Examples of a solid laser include a YAG laser, a YVO$_4$ laser, a YLF laser, a YAlO$_3$ laser, a Y$_2$O$_3$ laser, a glass laser, a ruby laser, an alexandrite laser, a Ti:sapphire laser or the like.

The laser beam emitted from the laser light source LS may enter the first lens LN1. The first lens LN1 may be a light-converging optical system. For example, the first lens LN1 may be a spherical lens or a Fresnel lens. The laser having After passing through the first lens LN1, the laser beam may be reflected by the first mirror MR1.

The first mirror MR1 may be a galvano mirror. The first mirror MR1 may be rotated to change an angle at which the laser beam is reflected. For example, the first mirror MR1 may serve as a scanner for changing a direction of the reflected laser beam.

The laser beam reflected from the first mirror MR1 may be sequentially reflected by the second mirror MR2 and the third mirror MR. The second mirror MR2 may be a convex mirror, and the third mirror MR3 may be a concave mirror.

The laser beam reflected from the third mirror MR3 may be irradiated onto the substrate 10.

A spot laser beam generated by the laser light source LS may pass through the first lens LN1, and be reflected by the first mirror MR1, the second mirror MR2, and the third mirror MR3 to be irradiated onto the substrate 10 at a location (a). Thereafter, the first mirror MR1 may be rotated to move the laser irradiation area irradiated with the laser beam in the Y direction (y). (Refer to dotted line of (a) to (b)) Accordingly, the laser beam may be irradiated to a line region using a spot laser, as one scan.

The irradiation position of the spot laser beam may be moved by a predetermined distance in the X direction (x), and the laser may be irradiated to the entire substrate 10 by repeating the laser scan.

For example, a laser beam having wavelength of 532 nm, frequency of 30 MHz, FWHM of 15 μm, energy density of 250 mJ/cm^2, laser scanning speed of 30 m/s, moving pitch in X direction of 2 mm, incident angle θ of 7° and divergence angle θy of 0±15 mrad may be irradiated onto the substrate 10. The first lens LN1, the first mirror MR1, the second mirror MR2 and the third mirror MR3 of the laser irradiation apparatus 100 may be configured to satisfy the conditions of the laser beam.

For example, an incident angle θ may be greater than 0° (deg) and less than 7.5°. If the incident angle were to be more that 0 degrees, a reflected light and a refracted light could interfere with each other at protrusions on the silicon surface to generate surface waves. An intensity period of the surface waves may cause the crystals grains to grow.

The converging angle α of the laser beam may be 30 mrad or less. The incident angle θ of the laser beam, the divergence angle θy of the laser beam, and the tilt angle φ with respect to the substrate may satisfy the following equation.

$$\theta y[\text{mrad}] < 9.33 \times \theta[\text{deg}] \qquad \text{<equation>}$$

Further, as described above, the converging angle α of the laser beam may be 30 mrad or less.

A laser scanning speed may be adjusted according to a rotating speed of the first mirror MR1.

An amorphous silicon layer may be formed on the substrate 10, and the amorphous silicon layer may be crystallized by laser irradiation to form poly-silicon.

According to the present embodiment, when the laser irradiation apparatus 100 is used, the crystallization can be performed by scanning the spot beam laser at a high speed. At this time, when a high-frequency solid state laser light source is used, the process cost may be reduced compared to excimer laser annealing using a general gas laser apparatus.

Further, when the laser beam is irradiated while maintaining the incident angle, the divergence angle, and the converging angle under a certain condition, a polygonal crystal having good alignment can be formed.

The plurality of lenses and mirrors of the laser irradiating apparatus 100 may be designed so that the characteristics such as the divergence angle θy of the laser can be kept constant during the laser scanning process.

In an example, when the wavelength is 532 nm, the frequency is 30 MHz, the beam size (FWHM) is 15 mm, the energy density is 250 mJ/cm^2, the beam scanning speed is 30 m/s, moving pitch along X direction is 2 mm, θ is 7°, and θy is 0±15 mrad, AFM analysis of the poly-silicon crystallized layer irradiated by laser showed protrusion alignment with a period of ~550 nm and no multiple interference on FFT (Fast Fourier Transform) figure.

On the other hand, when the divergence angle θy is 70 mrad or more during laser scanning, it is found that the alignment of crystals disappears. Accordingly, a suitable divergence angle θy may be preferably 70 mrad or less.

Accordingly, it can be seen that a desirable range of the incident angle is less than 7.5° (degrees) using the above-described equation.

Figure 9A:
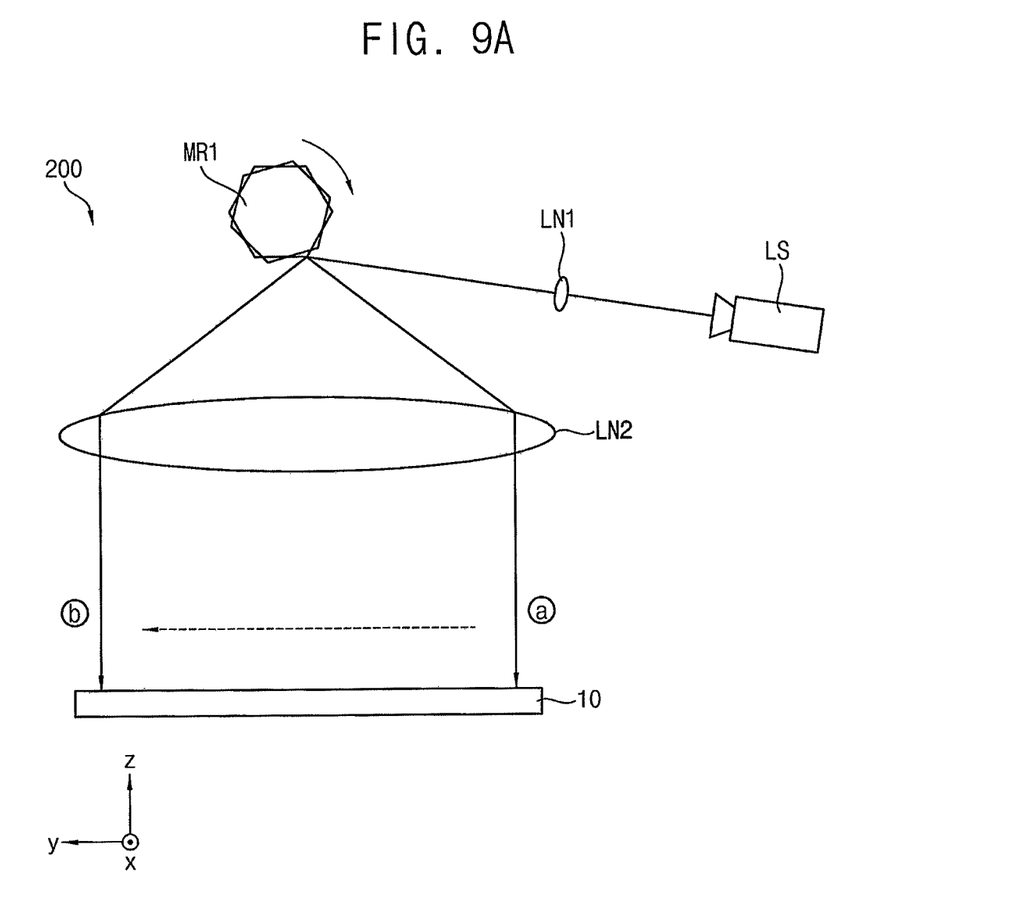
FIGS. 9A and 9B illustrate views of a laser irradiation apparatus 200 according to an embodiment.
Figure 9B:
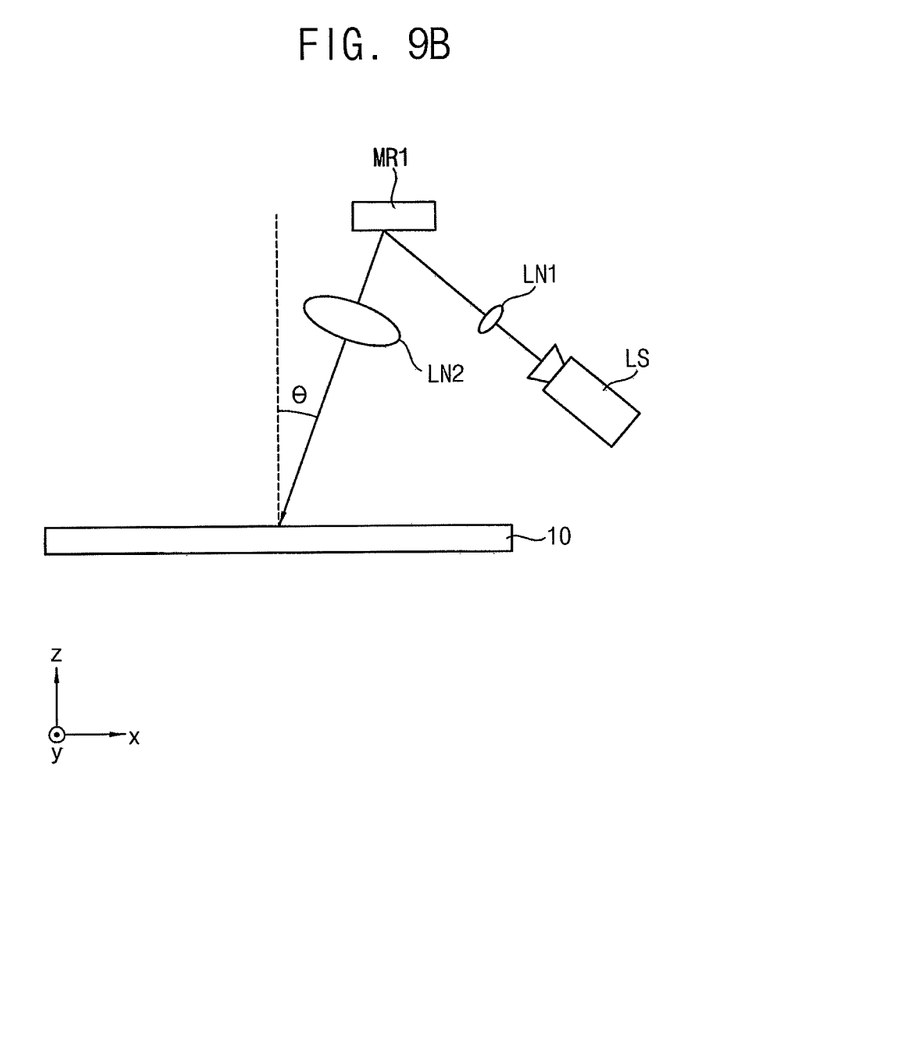

FIGS. 9A and 9B are views illustrating a laser irradiation apparatus 200 according to an embodiment.

Referring to FIGS. 9A and 9B, the laser irradiation apparatus 200 may be substantially the same as the laser irradiation apparatus 100 of FIGS. 8A and 8B except that an optical system disposed in a path of the laser beam. Therefore, the repeated explanation will be briefly described.

The laser irradiation apparatus 200 may include a laser light source LS, a first mirror LN1, a first mirror MR1, and a second lens LN2. The laser irradiation apparatus 200 may irradiate a spot beam laser onto a surface of the substrate 10 in a scanning manner. A dotted line in the figure shows one scan for one scan area, similar to the first scan step in the description of FIGS. 1 and 2.

The laser light source LS may be a laser oscillator. A laser beam may be generated by a continuous oscillation type laser oscillator or a pulse oscillation type laser oscillator having a repetition frequency of 30 MHz or more.

The laser oscillator may use a suitable continuous oscillation solid laser.

The laser beam emitted from the laser light source LS may enter the first lens LN1. The first lens LN1 may be a light-converging optical system. The first lens may be, for example, a spherical lens or a Fresnel lens. The laser beam having passed through the first lens LN1 may be reflected by the first mirror MR1.

The first mirror MR1 may be a polygonal mirror. The first mirror MR1 may be rotated to change an angle at which the laser is reflected. For example, the first mirror MR1 may serve as a scanner for changing a direction of the reflected laser.

The laser beam deflected by the first mirror MR1 may pass through the second lens LN2. The second lens LN2 may be an fθ Lens. The fθ lens may condense the laser so as to always focus on the substrate 10 to be irradiated.

The laser beam that has passed through the second lens LN2 may be irradiated onto the substrate 10.

A spot laser beam generated by the laser light source LS may pass the first mirror MR1, and the second lens LN2 to be irradiated onto the substrate 10 at the location (a). Thereafter, the first mirror MR1 may be rotated to move the laser irradiation area irradiated with the laser beam in the Y direction (y). (Refers to the dotted line from (a) to (b)). Accordingly, the laser beam can be irradiated onto a line region in one scan using a spot laser.

The irradiation position of the spot laser beam may be moved by a predetermined distance in the X direction (x), and the laser may be irradiated to the entire substrate 10 by repeating the laser scan.

Ranges of the laser beam incident angle θ, divergence angle θy, tilt angle φ, and converging angle α may be as described above.

The laser beam scanning speed may be adjusted according to the rotating speed of the first mirror MR1, which is a polygonal mirror.

According to a laser irradiation method a laser beam may be irradiated onto a surface of a substrate arranged in a plane formed by a X direction and a Y direction perpendicular to the X direction. The laser irradiation method includes a first scanning step wherein a laser is scanned in a first region having a width in the X direction and a length in the Y direction by moving a laser irradiation area on the surface of the substrate along the Y direction using a spot laser beam, a second scanning step wherein a laser beam is scanned in a second region having a width in the X direction and a length in the Y direction by moving a laser irradiation area on the surface of the substrate along the Y direction using the spot laser beam. A center of the second region may be spaced apart from a center of the first region in the X direction.

The laser irradiation apparatus for performing the laser irradiation method may irradiate a laser beam onto a substrate by a scanning method using a spot laser beam. At this time, incident angle θ, divergence angle θy, and tilt angle φ of the laser may satisfy θy [mrad]<9.33×θ [deg] and the converging angle α may be 30 mrad or less. Thereby, the laser irradiation method and the laser irradiation apparatus for producing poly-silicon of excellent quality may be provided, while the cost may be reduced.

Embodiments may be applied in the manufacturing of an organic light emitting display and various electronic apparatuses including the same. For example, embodiments may be applied to manufacturing of a mobile phone, a smart phone, a video phone, a smart pad, a smart watch, a tablet PC, a car navigation system, a television, a computer monitor, a notebook, etc.

By way of summation and review, a laser beam in a form of a line beam may be scanned at a constant pitch on the amorphous silicon layer on a substrate to perform a crystallization process. In general, the line beam is formed using a gas laser by a gas tube. Accordingly, manufacturing cost and maintenance cost of the laser beam apparatus are considerably problematic.

In addition, sizes and shapes of crystals may vary according to the laser irradiation method, and various attempts have been made to obtain uniformly arranged polygonal crystals in the poly-silicon of the thin film transistor.

Embodiments provide a laser irradiation method capable of forming high quality poly-silicon while reducing costs.

Embodiments also provide a laser irradiation apparatus for the laser irradiation method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A laser irradiation method to scan onto a surface of a substrate arranged in a plane formed by an X direction and a Y direction perpendicular to the X direction, the laser irradiation method comprising:
a first scanning wherein laser beam is scanned in a first region having a width in the X direction and a length in the Y direction by moving a first laser irradiation area on the surface of the substrate along the Y direction using a spot laser beam; and
a second scanning wherein laser beam is scanned in a second region different than the first region, the second region having a width in the X direction and a length in the Y direction by moving a second laser irradiation area on the surface of the substrate along the Y direction using the spot beam laser, wherein
a center of the second region is spaced apart from a center of the first region in the X direction,
a converging angle (α) of the laser beam in the X direction is not more than 30 mrad, and
an incident angle (θ) of the laser beam, a divergence angle (θy) of the laser beam in the Y direction, and a tilt angle φ with respect to the substrate satisfy the following equation $$\theta y[\text{mrad}] < 9.33 \times \theta[\text{deg}]. \qquad \text{<equation>}$$

2. The laser irradiation method as claimed in claim 1, wherein the incident angle (θ) is larger than 0° and less than 7.5°.

3. The laser irradiation method as claimed in claim 1, wherein the laser beam is generated by a continuous oscillation laser oscillator or a pulse oscillation laser oscillator having a repetition frequency of 30 MHz or more.

4. The laser irradiation method as claimed in claim 1, wherein the laser oscillator is a solid laser selected from a YAG laser, a YVO$_4$ laser, a YLF laser, a YAlO$_3$ laser, a Y$_2$O$_3$ laser, a glass laser, a ruby laser, an alexandrite laser and a Ti:sapphire laser.

5. The laser irradiation method as claimed in claim 1, wherein
the laser beam is irradiated onto the substrate through a laser light source, a first lens, and a scanner in order, and
the laser irradiation area is moved by a physical movement of the scanner.

6. The laser irradiation method as claimed in claim 5, wherein the scanner is a rotatable galvano mirror.

7. The laser irradiation method as claimed in claim 5, wherein the scanner is a rotatable polygonal mirror.

8. The laser irradiation method as claimed in claim 1, wherein
a diameter of the laser beam at a laser light source from which the laser beam is generated is less than or equal to 10 millimeters,
the diameter of the laser beam on the substrate is less than or equal to 100 micrometers, and
an optical path from the laser light source to the substrate is more than 1 meter in length.

9. The laser irradiation method as claimed in claim 1, including forming an amorphous silicon layer on the substrate, and irradiating the laser beam onto the amorphous silicon layer to crystallize the amorphous silicon layer.

10. The laser irradiation method as claimed in claim 1, wherein the first region and the second region partially overlap each other in a plan view.

* * * * *